US012772354B2

(12) United States Patent
Rachuri et al.

(10) Patent No.: US 12,772,354 B2
(45) Date of Patent: Oct. 20, 2026

(54) TIMING BASED SIGNAL VALLEY DETECTION

(71) Applicant: Silicon Laboratories Inc., Austin, TX (US)

(72) Inventors: Bhavna Rachuri, Austin, TX (US); Michael D. Mulligan, Austin, TX (US)

(73) Assignee: Silicon Laboratories Inc., Austin, TX (US)

( * ) Notice: Subject to any disclaimer, the term of this patent is extended or adjusted under 35 U.S.C. 154(b) by 131 days.

(21) Appl. No.: 18/633,257

(22) Filed: Apr. 11, 2024

(65) Prior Publication Data

US 2025/0324495 A1 Oct. 16, 2025

(51) Int. Cl.
*H05B 45/325* (2020.01)
*H03K 3/86* (2006.01)

(52) U.S. Cl.
CPC ............. *H05B 45/325* (2020.01); *H03K 3/86* (2013.01)

(58) Field of Classification Search
CPC .. H03K 5/1565; H03K 17/04106; H03K 3/86; H05B 45/3725; H05B 45/325; H05B 45/385; H05B 45/10; H05B 45/37; H05B 45/375; H05B 45/397; H05B 45/345; H05B 45/32; H05B 45/347; H05B 45/38; H05B 45/50; H05B 45/52; H05B 47/23; H05B 45/355; H05B 47/10; H05B 45/00; H05B 45/14; H05B 45/48; H05B 47/24; H05B 39/048; H05B 41/3924; H05B 45/20; H05B 45/30; H05B 45/34; H05B 45/36; H05B 47/16

(Continued)

(56) References Cited

U.S. PATENT DOCUMENTS 6,166,496 A 12/2000 Lys
7,821,237 B2 10/2010 Melanson
(Continued)

FOREIGN PATENT DOCUMENTS

CN 114205952 * 11/2021 ............. H05B 45/30

OTHER PUBLICATIONS

Aguilar, D., and Henze, C.P., "LED Driver Circuit with Inherent PFC," 2010 Twenty-Fifth Annual IEEE Applied Power Electronics Conference and Exposition (APEC), Feb. 21-25, 2010, pp. 605-610.

(Continued)

*Primary Examiner* — John W Poos
(74) *Attorney, Agent, or Firm* — Zagorin Cave LLP

(57) ABSTRACT

An embodiment of a timing-based signal valley detection technique improves efficiency and reduces electromagnetic emissions due to ringing by controlling the off-time of a power switch in an LED driver or power converter application. The timing-based technique estimates a time of occurrence of a valley in the drain voltage of the power switch. The timing-based technique uses an analog comparator to sense the drain voltage of a power switch. The timing-based technique uses digital circuits to estimate the time of occurrence of the valley in the drain voltage and to adjust the duty cycle (e.g., adjusts the off-time by terminating the off-time) of a gate control signal of the power switch. The technique may use off-chip resistive voltage divider circuits to sense the drain voltage of the power switch and to generate a reference voltage and other circuits are integrated in an integrated circuit device.

20 Claims, 5 Drawing Sheets

(58) Field of Classification Search
USPC .................................................. 327/108–112
See application file for complete search history.

(56) References Cited

U.S. PATENT DOCUMENTS

| | | | | |
|---|---|---|---|---|
| 8,604,767 | B2 | 12/2013 | Liu | |
| 9,143,033 | B2 | 9/2015 | Tai | |
| 9,699,848 | B2 * | 7/2017 | Herfurth | H03K 17/04106 |
| 9,810,414 | B2 | 11/2017 | Kim | |
| 11,057,029 | B2 | 7/2021 | Westwick et al. | |
| 11,095,209 | B2 * | 8/2021 | Imanaka | H02M 1/4241 |
| 11,362,646 | B1 | 6/2022 | Tesu et al. | |
| 2012/0126713 | A1 * | 5/2012 | Horino | H02M 1/4225<br>315/201 |
| 2014/0327372 | A1 * | 11/2014 | Zhang | H05B 47/185<br>315/224 |
| 2015/0115813 | A1 * | 4/2015 | Hussain | G09G 3/3406<br>315/186 |
| 2015/0292686 | A1 | 10/2015 | Negley | |
| 2016/0294282 | A1 * | 10/2016 | Herfurth | H05B 45/375 |
| 2019/0032887 | A1 | 1/2019 | Jeorg | |

OTHER PUBLICATIONS

Sangrody, R., et al., “Semi-Valley Switching Method for Buck LED Driver to Increase its Efficiency and Performance,” IET Power Electronics, vol. 13, Issue 10, Revised Mar. 10, 2020, pp. 1966-1973.

George, J., “Cycle Scavenging on C2000 MCUs, Part 7: PWM Valley Switching,” SSZT840, Dec. 2017, pp. 1-4, Texas Instruments Incorporated.

Global Lighting Forum, “Switched Mode LED Power Supplies | SMPS LED Drivers,” downloaded from https://www.shine.lighting/products/smps-led-drivers/ on Feb. 23, 2024, 9 pages.

* cited by examiner

TIMING BASED SIGNAL VALLEY DETECTION

BACKGROUND

Field of the Invention

This application relates to electronic circuits in general, and more particularly to driver circuits.

Description of the Related Art

A typical light-emitting diode (LED) system includes a string of LEDs coupled in series with an inductor and a power switch. An AC power supply is coupled to a rectifier and a capacitor to provide a constant current or voltage. A control loop includes an LED driver that switches the power switch on and off. Switching performance and efficiency of the LED driver affects power losses and efficiency of the system. A valley switching method uses the resonance of the parasitic capacitance of the power switch and the inductor to determine when to turn on a pulse width modulated signal for a next switching cycle. The valley switching method turns on the pulse-width modulated signal at a point when the voltage at the resonant node is at a local minimum to reduce power loss and increase efficiency. Typical implementations of the valley switching method use analog circuits (e.g., switched capacitor circuits that sample a signal and a circuit that compares two most recent samples) to detect the valley in the resonant signal. Those analog circuits have stringent offset specifications, are manufacturing process dependent, and require substantial redesign when changing the target semiconductor manufacturing process. Accordingly, improved techniques for implementing valley switching in an LED driver or a switched-mode power supply application are desired.

SUMMARY OF EMBODIMENTS OF THE INVENTION

In at least one embodiment, a method for controlling a switch includes generating a timestamp corresponding to an estimated occurrence of a local minimum in a sensed voltage during a first interval of a first switching cycle of a switching control signal based on comparison of the sensed voltage to a reference voltage. The method includes starting a second interval of a subsequent switching cycle of the switching control signal based on the timestamp. Generating the timestamp may include starting a counter in response to the sensed voltage crossing a predetermined threshold voltage in a first direction and stopping the counter in response to the sensed voltage crossing the predetermined threshold voltage in a second direction. The second direction opposes the first direction. The timestamp is based on a count value of the counter after stopping the counter. Generating the timestamp may further include storing the count value divided by two as the timestamp. The method may include updating the timestamp after a predetermined number of switching cycles of the switching control signal. Starting the second interval of the subsequent switching cycle of the switching control signal may include starting a counter in response to the sensed voltage crossing a predetermined threshold voltage in a first direction and deasserting a disable signal based on a comparison of a counter value of the counter to the timestamp. The switching control signal may be generated based on the disable signal.

In at least one embodiment, an integrated circuit product includes valley detection logic configured to generate a timestamp corresponding to an estimated occurrence of a local minimum in a sensed voltage during a first interval of a first switching cycle of a switching control signal based on comparison of the sensed voltage to a reference voltage. The integrated circuit product includes control logic configured to generate the switching control signal having an adjustable pulse width. The adjustable pulse width is based on the timestamp. The integrated circuit product may include a comparator configured to generate a comparison signal based on the reference voltage and the sensed voltage. The valley detection logic may include a first counter that is enabled in response to the sensed voltage crossing a predetermined threshold voltage in a first direction and disabled in response to the sensed voltage crossing the predetermined threshold voltage in a second direction. The second direction opposes the first direction. The valley detection logic may include a storage element configured to store as the timestamp, a count value divided by two. The count value may be a state of the first counter after stopping the first counter. The control logic may include a second counter enabled in response to the sensed voltage crossing the predetermined threshold voltage in the first direction and digital logic configured to deassert a disable signal based on a comparison of the timestamp to a second count value of the second counter. The integrated circuit product may include additional logic configured to generate the switching control signal based on the disable signal.

In at least one embodiment, a method for calibrating a duty cycle of a switching control signal includes modulating a pulse width of a control signal based on a timestamp corresponding to an estimated time of occurrence of a valley in a resonant ringing of a sensed voltage and a count value of a counter started in response to the sensed voltage crossing a threshold voltage in a first direction. The method may include generating the timestamp. Generating the timestamp may include starting a second counter in response to the sensed voltage crossing a predetermined threshold voltage in the first direction and stopping the second counter in response to the sensed voltage crossing the predetermined threshold voltage in a second direction. The second direction opposes the first direction. The timestamp may be based on a second count value of the second counter after stopping the second counter. The method may include periodically updating the timestamp based on a second counter started in response to the sensed voltage crossing the threshold voltage in the first direction and stopped in response to the sensed voltage crossing the threshold voltage in a second direction opposing the first direction. The method may include deasserting a disable signal based on a comparison of the count value of the counter to the timestamp. The control signal may be generated based on the disable signal. The method may include enabling valley detection to generate the timestamp in response to a regulated input voltage exceeding a voltage across a load driven by the output node.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates similar or identical items.

DETAILED DESCRIPTION

Figure 1:
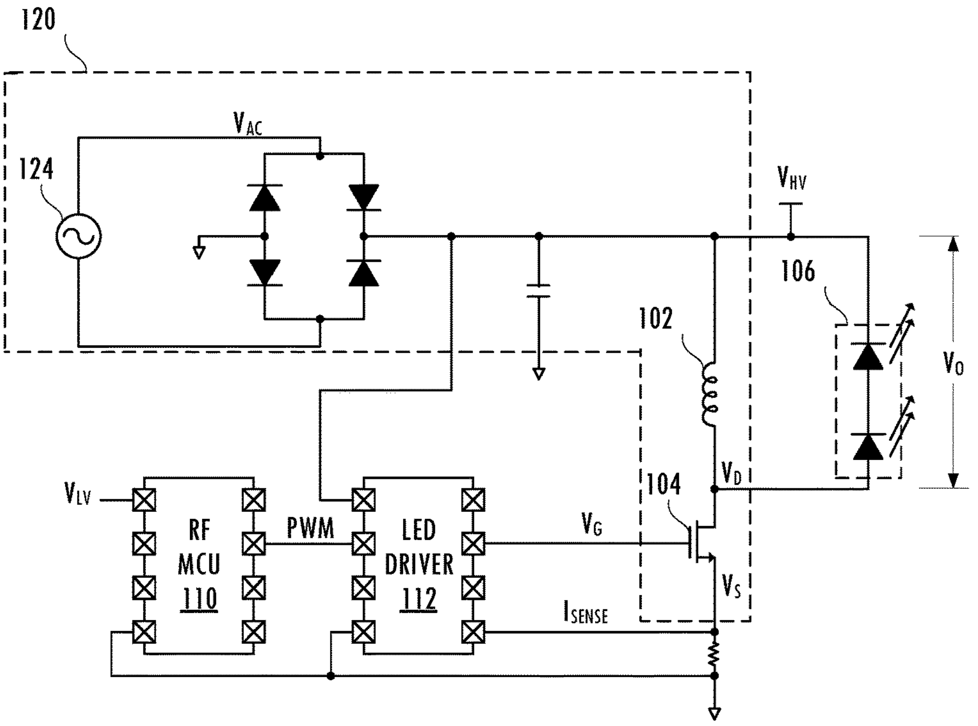
FIG. 1 illustrates a circuit diagram of an exemplary lighting system including separate radio frequency controller device and light-emitting diode driver device.
Figure 2:
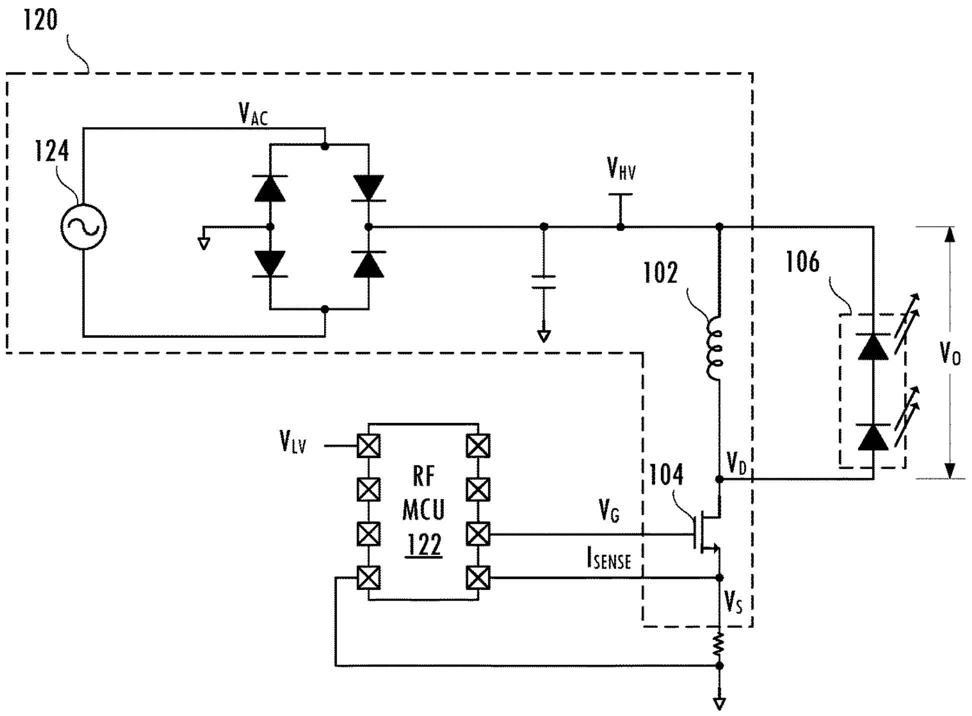
FIG. 2 illustrates a circuit diagram of an exemplary lighting system including an integrated radio frequency controller and light-emitting diode driver device.

Referring to FIGS. 1 and 2, a wireless light-emitting diode (LED) light bulb is an exemplary wireless device that includes a radio frequency (RF) transceiver circuit and an LED driver circuit. In some embodiments, the RF transceiver and the LED driver circuit are included in RF microcontroller unit (MCU) device 110 and the LED driver device 112, respectively. In other embodiments, the functions of the RF transceiver and the LED driver circuit are integrated into RF MCU device 122 to reduce design and manufacturing costs. The LED driver (e.g., in LED driver device 112 or in RF MCU device 122) provides gate control signal $V_G$, which is based on a pulse-width modulated control signal (e.g., 1 kHz), to power switch 104. In at least one embodiment, power switch 104 is an n-type power transistor, e.g., a power metal-oxide-semiconductor field-effect transistor (MOSFET) that is designed to sustain substantial power levels and operate at high switching speeds at low power gate drive. For example, power switch 104 is a MOSFET having vertically diffused metal-oxide-semiconductor (VDMOS) structure, double-diffused metal-oxide-semiconductor (DMOS) structure, or laterally diffused metal-oxide-semiconductor (LDMOS) structure.

In an embodiment, when power switch 104 is on, a current through inductor 102 increases from zero and energy transfers to the magnetic field of inductor 102. When enough energy is stored by inductor 102, gate control signal $V_G$ turns off power switch 104 and inductor 102 delivers stored energy to LED circuit 106. The current through inductor 102 ramps down to zero and completely demagnetizes inductor 102 every period of gate control signal $V_G$. Under some conditions, as inductor current $I_L$ reaches zero, inductor current $I_L$ becomes slightly negative, which pulls drain voltage $V_D$ down and inductor 102 and the parasitic capacitance of power switch 104 cause drain voltage $V_D$ to resonate according to a resonant transient response until the next cycle of gate control signal $V_G$ starts. The resonant transient response of the voltage on the parasitic drain capacitor when power switch 104 is off is approximately: $V_{DS}=V_C(t)=V_O \cos \omega t+V_{HV}$, where $$\omega = \frac{1}{\sqrt{LC}}, L$$

is inductance of inductor 102, C is the parasitic drain capacitance of power switch 104, and output voltage $V_O$ is the voltage across LED circuit 106.

In an embodiment, when power supply voltage $V_{HV}$ is less than output voltage $V_O$ (i.e., $V_{HV}<V_O$), the transient response is clipped, drain voltage $V_D$ reaches zero but does not become negative and a valley detection technique to switch on power switch 104 is not substantially beneficial. However, when power supply voltage $V_{HV}$ is greater than output voltage $V_O$ (i.e., $V_{HV}>V_O$), switching on power switch 104 when drain voltage $V_D$ has a local minimum value (i.e., a valley in the resonant transient response of drain voltage $V_D$) substantially reduces energy loss caused by the resonance of drain voltage $V_D$.

Figure 3:
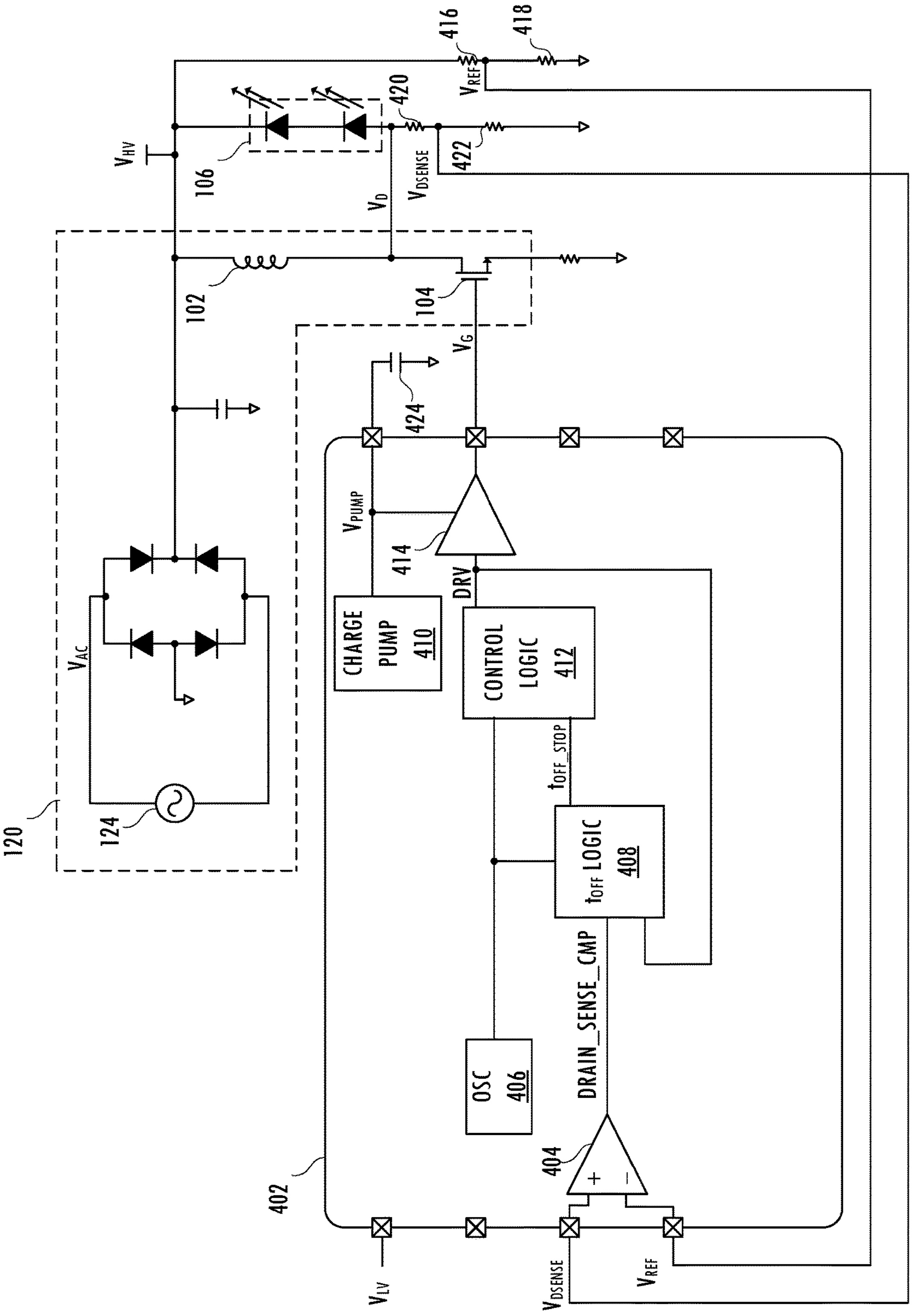
FIG. 3 illustrates a circuit diagram of a light-emitting diode driver device including a timing-based signal valley detector consistent with at least one embodiment of the invention.
Figure 4:
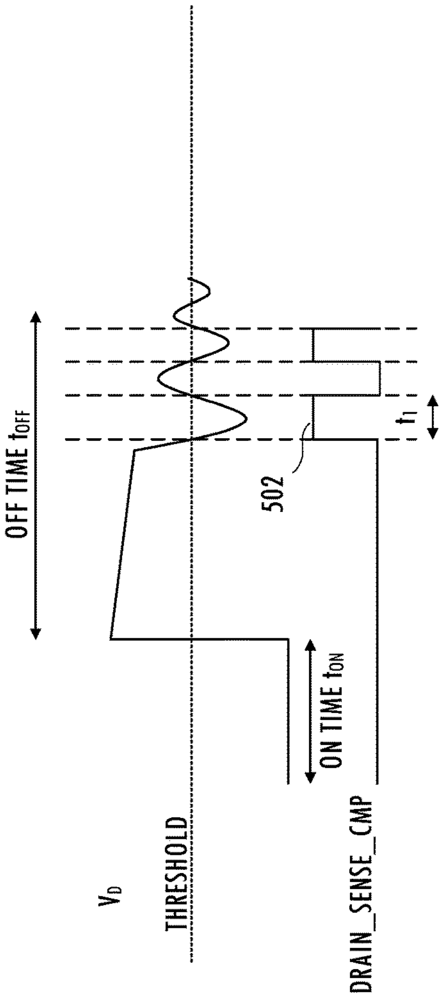
FIG. 4 illustrates a detailed timing waveform for a drain voltage of a power switch and an output of a comparator of a lighting system including an LED driver device of FIG. 3.
Figure 5:
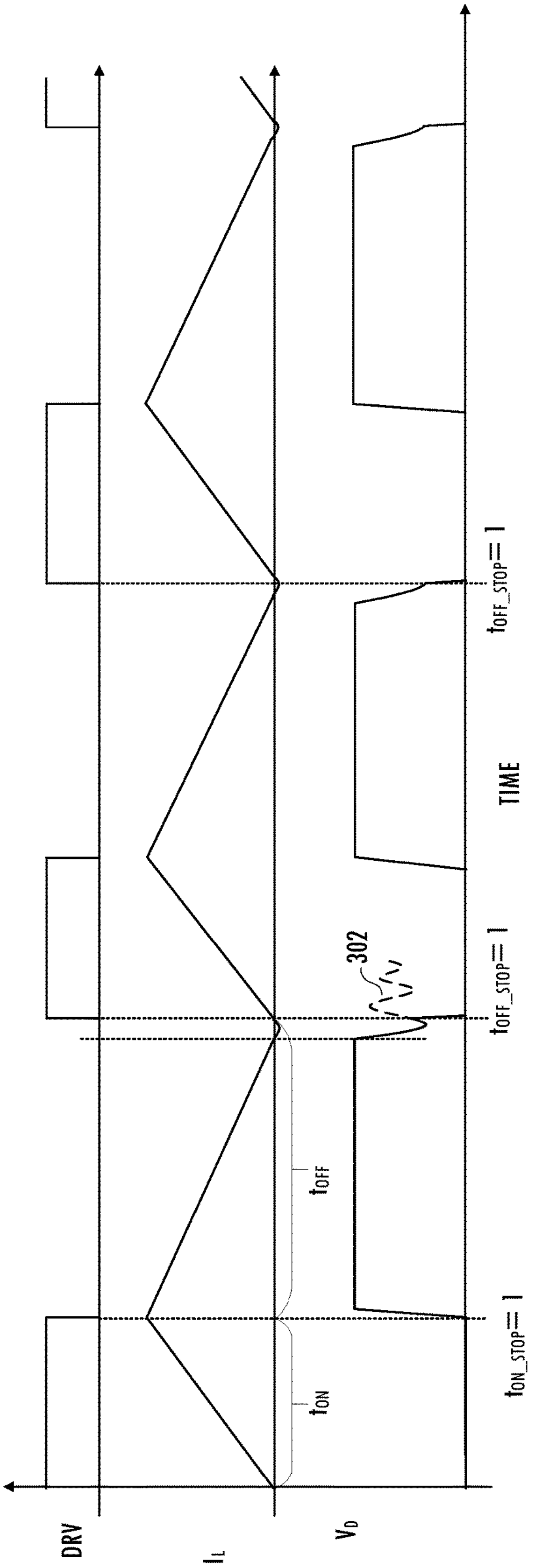
FIG. 5 illustrates timing waveforms for a driver control signal, an inductor current, and a drain voltage of a power switch associated with the exemplary lighting system of FIG. 3 consistent with at least one embodiment of the invention.

Referring to FIGS. 3-5, in at least one embodiment, integrated circuit device 402 (e.g., an RF MCU device including an LED driver or an LED driver device) implements a timing-based technique for detecting a valley (i.e., a local minimum) in the resonant transient response of drain voltage $V_D$ of power switch 104. The timing-based signal valley detection technique uses an analog comparator to sense drain voltage $V_D$ of power switch 104. The timing-based signal valley detection technique uses the sensed drain voltage signal and digital circuits to estimate a time of occurrence of the valley of drain voltage $V_D$ and to adjust the duty cycle of gate control signal $V_G$. For example, terminating the off-time of power switch 104 and starting the on-time of power switch 104 at a time corresponding to an estimated occurrence of the valley in drain voltage $V_D$ truncates resonant transient response 302 and adjusts the duty cycle of control signal DRV and the duty cycle of gate control signal $V_G$.

In at least one embodiment, the timing-based signal valley detection technique uses off-chip, resistive voltage divider circuits, e.g., resistors 420 and 422 and resistors 416 and 418, to generate sensed voltage $V_{DSENSE}$ and to generate reference voltage $V_{REF}$, respectively, and other circuits are integrated into integrated circuit device 402. However, in other embodiments, the resistor dividers are also integrated into integrated circuit device 402. By generating reference voltage $V_{REF}$ using the power supply voltage $V_{HV}$ provided by power converter 120 (e.g., a rectifier), comparator 404 rejects any power supply noise on power supply voltage $V_{HV}$.

In an embodiment, comparator 404 generates signal DRAIN_SENSE_CMP, which is indicative of the difference between reference voltage $V_{REF}$ and sensed voltage $V_{DSENSE}$. In an embodiment, comparator 404 asserts signal DRAIN_SENSE_CMP in response to sensed voltage $V_{DSENSE}$ being less than reference voltage $V_{REF}$ and deasserts signal DRAIN_SENSE_CMP in response to sensed voltage $V_{DSENSE}$ being greater than reference voltage $V_{REF}$. In at least one embodiment, comparator 404 includes a two-stage strong-arm dynamic-latch based comparator. The first stage includes a common source differential pair of transistors with resistive loads for pre-amplification. The second stage includes a latch structure for reducing kickback noise from a clock signal and a reference circuit generates a bias current that is mirrored and amplified to generate a tail current for the differential pair of transistors. However, in other embodiments, other comparator circuit topologies are used. Comparator 404 provides signal DRAIN- _SENSE_CMP to time off logic 408. Time off logic 408 uses signal DRAIN_SENSE_CMP to generate signal $t_{OFF\_STOP}$ based on whether drain voltage $V_D$ has an estimated local minimum value that corresponds to a valley in the resonant transient response of drain voltage $V_D$.

In at least one embodiment, during a calibration mode of operation, time off logic 408 estimates the time of occurrence of the valley in the resonant transient response of drain voltage $V_D$ by measuring a pulse that is generated in response to an asserted value of signal DRAIN_SENSE_CMP during the off-time (i.e., $t_{OFF}$) of power switch 104. In at least one embodiment, pulse 502 is asserted when sensed voltage $V_{DSENSE}$ falls below reference voltage $V_{REF}$ and deasserted when sensed voltage $V_{DSENSE}$ rises above reference voltage $V_{REF}$. In at least one embodiment, during calibration mode, time-off logic 408 asserts signal $t_{OFF\_STOP}$ in response to sensed voltage $V_{DSENSE}$ rising above reference voltage $V_{REF}$. Time off logic 408 estimates the time of occurrence of the valley in the resonant transient response of drain voltage $V_D$ for use in subsequent switching cycles of control signal DRV in the normal mode of operation. In an embodiment, the estimated time of occurrence of the valley in the resonant transient response of drain voltage $V_D$ is half the width of time $t_1$ (e.g., half of the width of pulse 502). During a normal mode of operation, time off logic 408 uses the estimated time of occurrence, a counter, and digital logic to generate signal $t_{OFF\_STOP}$. In an embodiment, signal $t_{OFF\_STOP}$ has a value measured from the comparator trip point (e.g., the point when DRAIN_SENSE_CMP indicates that sensed voltage $V_{DSENSE}$ falls below reference voltage $V_{REF}$) and incremented by the estimated value.

In an embodiment of power converter 120, AC power source 124 has a line frequency (e.g., 60 Hz) that is much lower than the frequency of switching power switch 104 (e.g., 150-400 kHz) and oscillator 406 (e.g., 5-40 MHz, e.g., 20 MHz), which is used to control at least state elements in time off logic 408 and control logic 412. When power switch 104 is off, drain voltage $V_D$ is the forward voltage of LED circuit 106 above power supply voltage $V_{HV}$. Accordingly, the comparator threshold voltage (e.g., reference voltage $V_{REF}$) is a function of power supply voltage $V_{HV}$. Time off logic 408 stores the estimated time of occurrence of the valley as signal TIMESTAMP to be used to generate signal $t_{OFF\_STOP}$ for the next M cycles of power switch 104. In at least one embodiment, time off logic 408 updates signal TIMESTAMP every M cycles of signal DRV. Control logic 412 uses signal $t_{OFF\_STOP}$ to generate signal DRV, which is used to generate gate control signal $V_G$. In at least one embodiment, control logic 412 is also responsive to a signal (e.g., signal $t_{ON\_STOP}$) that indicates the end of the on-time and that is calibrated according to a peak of the AC line voltage (e.g., 120 V) that is estimated by using a voltage divider to sense power supply voltage $V_{HV}$. The $t_{OFF}$ interval begins immediately after the tox interval ends. The tox interval begins again in response to the $t_{OFF}$ interval ending, i.e., in response to $t_{OFF\_STOP}$ being asserted (e.g., in response to detecting the valley corresponding to a current zero-crossing of inductor current $I_L$).

In at least one embodiment, driver 414 includes a non-overlap circuit configured to generate pull-up and pull-down control signals based on control signal DRV. Charge pump 410, capacitor 424, and driver 414 use voltage $V_{PUMP}$ to level shift the pull-up and pull-down control signals received by the non-overlap circuit to generate gate control signal $V_G$ in a voltage domain suitable for driving power switch 104. In at least one embodiment, driver 414 includes a stack of high-voltage transistors including complementary switching devices stacked with corresponding cascode devices that are biased to limit switching device stresses. In general, the target manufacturing process may provide transistors having different breakdown voltages and speeds of operation as a result of gate terminals formed using oxide layers of different thicknesses. An exemplary high-voltage transistor has a thicker gate oxide and therefore has a higher breakdown voltage but is slower than a low-voltage transistor that has a thinner gate oxide thickness. Transistors of integrated circuit device 402 are low-voltage transistors operating at voltage levels consistent with low voltage power supply $V_{LV}$ (e.g., 3.3V) unless specified otherwise.

Figure 6:
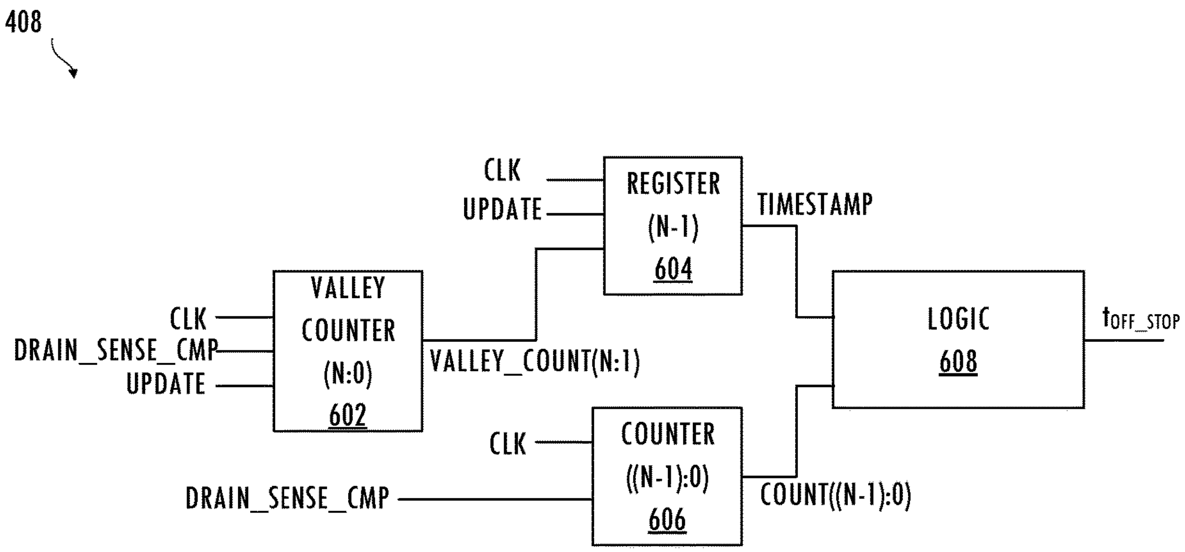
FIG. 6 illustrates a functional block diagram of logic of a timing-based signal valley detector consistent with at least one embodiment of the invention.

Referring to FIGS. 3, 4, and 6, in an embodiment, comparator 404 asserts signal DRAIN_SENSE_CMP in response to sensed voltage $V_{DSENSE}$ falling below reference voltage VREF, which is a predetermined threshold voltage (i.e., sensed voltage $V_{DSENSE}$ crossing a predetermined threshold voltage in a first direction), and comparator 404 deasserts DRAIN_SENSE_CMP in response to sensed voltage $V_{DSENSE}$ exceeding voltage $V_{REF}$ (i.e., sensed voltage $V_{DSENSE}$ crossing the predetermined threshold voltage in a second direction opposing the first direction). In at least one embodiment, time off logic 408 receives control signal UPDATE that is asserted during the calibration mode of operation and enables time off logic 408 to calibrate signal $t_{OFF\_STOP}$. During calibration, time off logic 408 enables valley counter 602 while signal DRAIN_SENSE_CMP is asserted. When enabled, valley counter 602 increments counter state VALLEY_COUNT (N:0) to generate signal TIMESTAMP corresponding to the width of pulse 502. The valley of drain voltage $V_D$ is estimated to be at the midpoint of pulse 502 at time $t_1/2$. Register 604 stores right-shifted state of valley counter 602 (e.g., bits VALLEY_COUNT (N:1)) and provides its stored value as signal TIMESTAMP to logic 608.

In at least one embodiment, time off logic 408 is enabled synchronously to the power switch being turned off (e.g., control signal DRV='0') and includes a state machine that generates control signals used within logic 408. In at least one embodiment, logic 608 generates control signal UPDATE further based on a predetermined number of cycles of control signal DRV and asserts control signal UPDATE in response to detecting a change of control signal DRV. Control signal UPDATE causes an update to register 604 storing digital signal TIMESTAMP corresponding to a current value of digital signal VALLEY_COUNT. In an embodiment, in response to updating register 604, the state machine clears other state elements.

In at least one embodiment, logic 608 receives signal COUNT, which is a count value generated by counter 606 by incrementing while signal DRAIN_SENSE_CMP is asserted. In an embodiment of time off logic 408, comparator 404 asserts signal DRAIN_SENSE_CMP in response to sensed voltage $V_{DSENSE}$ falling below reference voltage $V_{REF}$. In an embodiment of time off logic 408, counter 606 resets in response to deassertion of signal DRAIN_SENSE_CMP. In an embodiment, logic 608 compares signal COUNT to signal TIMESTAMP and triggers a pulse of signal $t_{OFF\_STOP}$ in response to signal COUNT being equal to signal TIMESTAMP. For example, logic 608 includes a digital comparator that asserts signal $t_{OFF\_STOP}$ in response to signal TIMESTAMP being equal to signal COUNT. In at least one embodiment, the digital comparator includes an exclusive-or-based comparator and state elements to store and synchronize signal $t_{OFF\_STOP}$.

In at least one embodiment, logic 608 resets valley counter 602 after calibration, i.e., after estimating the time of occurrence of the valley in drain voltage $V_D$ and storing estimate VALLEY COUNT as digital signal TIMESTAMP in register 604. Depending on the gate capacitance of power switch 104, any delay between the state of the LED driver causing gate control voltage $V_G$ to be a low value to turn off power switch 104 and clearing signal DRAIN_SENSE_CMP may introduce errors in detecting the valley of drain voltage $V_D$ and generation of signal $t_{OFF\_STOP}$. Accordingly, in at least one embodiment, logic 608 includes a blanking circuit (not shown) configured to delay valley detection logic until signal DRAIN_SENSE_CMP is stable and in the correct state after power switch 104 turns off. An embodiment of the blanking circuit implements a delay by an exclusive-OR of a counter state with a predetermined delay stored in a register. In at least one embodiment, that predetermined delay is programmed when enabling time off logic 408.

In an embodiment, state machine elements in logic 608 are held in a reset state unless calibration is enabled. In response to detecting a valley (i.e., signal DRAIN_SENSE_CMP is asserted and then deasserted), logic 608 asserts a control signal that makes latches in logic 608 opaque (i.e., closes the latches) to complete updating the digital signal TIMESTAMP.

Figure 7:
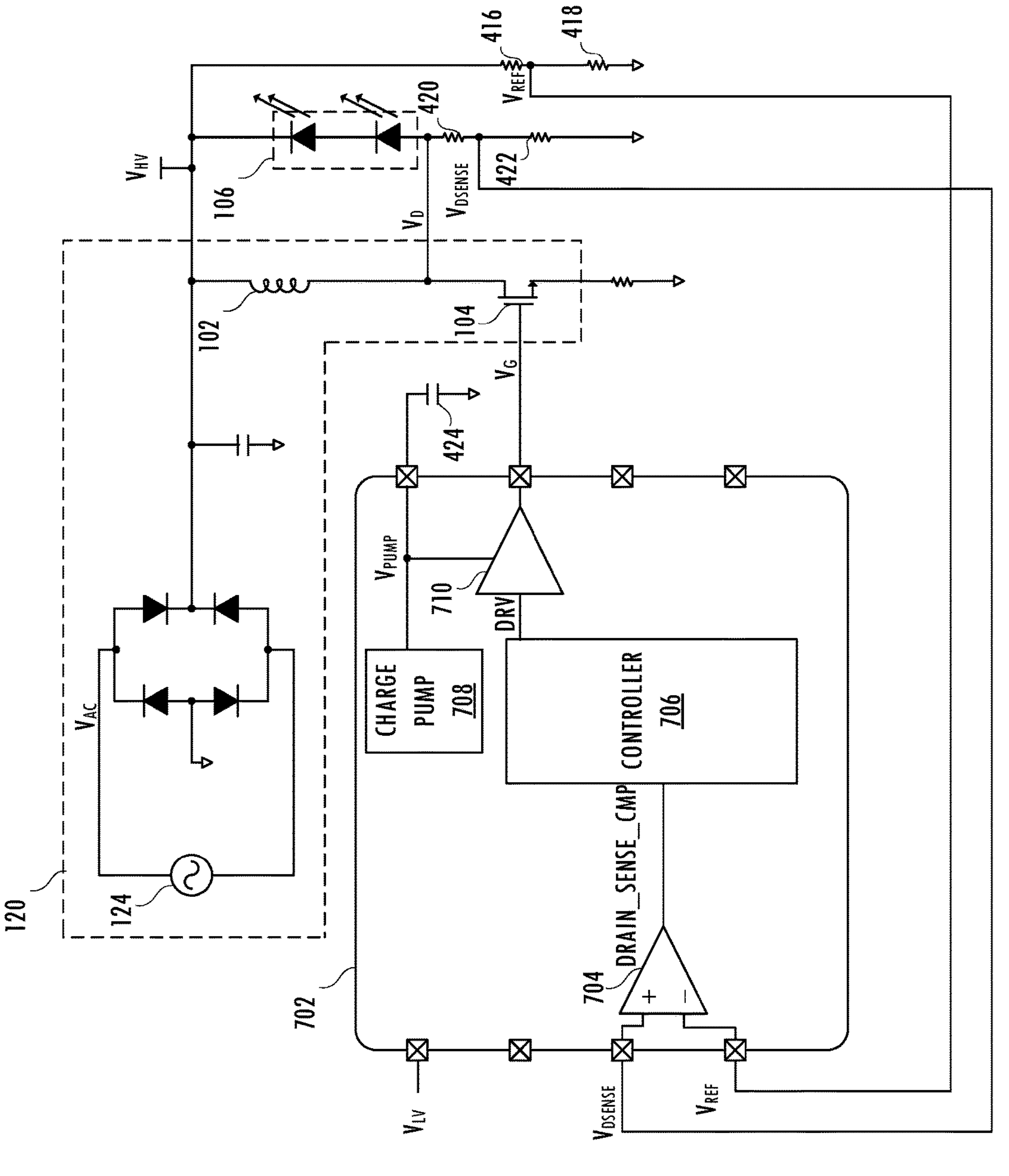
FIG. 7 illustrates an alternate embodiment of the circuit diagram of a light-emitting diode driver device including a timing-based signal valley detector consistent with at least one embodiment of the invention.

In an embodiment, control logic 412 uses signal $t_{OFF\_STOP}$ to end the off-time (i.e., the $t_{OFF}$ interval) of power switch 104 by causing control logic 412 to assert control signal DRV to begin the on-time (i.e., the $t_{ON}$ interval) of power switch 104 in response to detecting a valley in drain voltage $V_D$. Referring to FIG. 7, in at least one embodiment, rather than use only custom digital circuits to generate DRV, integrated circuit device 702 includes charge pump 708, driver 710 and controller 706, which executes instructions (e.g., firmware) to generate DRV based on DRAIN_SENSE_CMP received from comparator 704. Controller 706 may be a microprocessor, embedded processor, an application specific circuit, a programmable circuit, a microcontroller, or another similar device.

Thus, techniques for improving efficiency and controlling emissions by controlling the off time of a power switch in an LED driver application by estimating a time of occurrence of a valley in the drain voltage of a power switch has been disclosed. The techniques do not require estimation of the exact frequency of the signal, hence a static offset of a comparator does not affect operation. In at least one embodiment, since the comparator threshold does not vary significantly between a start and an end of counter operations, the time of occurrence of the signal valley is accurately estimated by adding the timing information stored in the register to a time step when comparator output toggles again. The techniques use digital circuits that are resistant to analog non-idealities such as comparator offset, mismatch, delays, etc., and are easily implemented in future manufacturing processes with negligible or no redesign.

The description of the invention set forth herein is illustrative and is not intended to limit the scope of the invention as set forth in the following claims. For example, while the invention has been described in an embodiment in which an LED driver is described, one of skill in the art will appreciate that the teachings herein can be utilized with other driver circuits or other circuits where signal valley detection is useful (e.g., switched-mode power supplies). In addition, while the invention has been described in an embodiment in which an LED driver is incorporated with RF communications circuitry for a smart light bulb application, other embodiments of the LED driver are included in manual applications and do not include RF communications circuitry. The terms "first," "second," "third," and so forth, as used in the claims, unless otherwise clear by context, are to distinguish between different items in the claims and do not otherwise indicate or imply any order in time, location or quality. For example, "a first received signal" and "a second received signal," do not indicate or imply that the first received signal occurs in time before the second received signal. Variations and modifications of the embodiments disclosed herein may be made based on the description set forth herein, without departing from the scope of the invention as set forth in the following claims.

What is claimed is:

1. A method for controlling a switch comprising:

generating a timestamp corresponding to an estimated occurrence of a local minimum in a sensed voltage during a first interval of a first switching cycle of a switching control signal based on comparison of the sensed voltage to a reference voltage and based on a count value of a counter;

starting a second interval of a subsequent switching cycle of the switching control signal based on the timestamp, wherein generating the timestamp comprises:

starting the counter in response to the sensed voltage crossing a predetermined threshold voltage in a first direction; and stopping the counter in response to the sensed voltage crossing the predetermined threshold voltage in a second direction, the second direction opposing the first direction; and wherein the timestamp is based on the count value of the counter after stopping the counter.

2. The method as recited in claim 1 wherein generating the timestamp further comprises:

storing the count value divided by two as the timestamp.

3. The method as recited in claim 1 further comprising:

updating the timestamp after a predetermined number of switching cycles of the switching control signal.

4. The method as recited in claim 1 wherein starting the second interval of the subsequent switching cycle of the switching control signal comprises:

starting a second counter in response to the sensed voltage crossing the predetermined threshold voltage in the first direction; and deasserting a disable signal based on a comparison of a counter value of the second counter to the timestamp, wherein the switching control signal is generated based on the disable signal.

5. The method as recited in claim 1 wherein the sensed voltage is on a drain node of a power switch driving a light emitting diode circuit coupled to a power supply node.

6. The method as recited in claim 5 wherein the reference voltage is received from a resistor divider coupled to the power supply node.

7. The method as recited in claim 5 wherein the first interval of the first switching cycle corresponds to an off-time of the power switch controlled by the switching control signal and the second interval of the subsequent switching cycle corresponds to an on-time of the power switch.

8. An integrated circuit product comprising:

valley detection logic configured to generate a timestamp corresponding to an estimated occurrence of a local minimum in a sensed voltage during a first interval of a first switching cycle of a switching control signal based on comparison of the sensed voltage to a reference voltage and based on a count value of a first counter; and control logic configured to generate the switching control signal having an adjustable pulse width, the adjustable pulse width being based on the timestamp, wherein the valley detection logic comprises:

the first counter, wherein the first counter is enabled in response to the sensed voltage crossing a predetermined threshold voltage in a first direction and disabled in response to the sensed voltage crossing the predetermined threshold voltage in a second direction, the second direction opposing the first direction; and a storage element configured to store as the timestamp, the count value divided by two, the count value being a state of the first counter after stopping the first counter.

9. The integrated circuit product as recited in claim 8 further comprising:

a comparator configured to generate a comparison signal based on the reference voltage and the sensed voltage.

10. The integrated circuit product as recited in claim 8 wherein the control logic comprises:

a second counter enabled in response to the sensed voltage crossing the predetermined threshold voltage in the first direction; and digital logic configured to deassert a disable signal based on a comparison of the timestamp to a second count value of the second counter.

11. The integrated circuit product as recited in claim 10 further comprising:

additional logic configured to generate the switching control signal based on the disable signal.

12. The integrated circuit product as recited in claim 8 further comprising:

a light-emitting diode circuit coupled to a power supply node;

a power switch having a drain terminal coupled to the light-emitting diode circuit;

a first voltage divider coupled to the drain terminal and configured to provide the sensed voltage; and a second voltage divider coupled to the power supply node and configured to provide the reference voltage.

13. A method for calibrating a duty cycle of a switching control signal, the method comprising:

modulating a pulse width of a control signal at a time based on a timestamp corresponding to an estimated time of occurrence of a valley in a resonant ringing of a sensed voltage and a count value of a counter started in response to the sensed voltage crossing a threshold voltage in a first direction, the timestamp being generated based on a second count value of a second counter; and deasserting a disable signal based on a comparison of the count value of the counter to the timestamp, wherein the control signal is generated based on the disable signal.

14. The method as recited in claim 13 further comprising:

generating the timestamp, wherein generating the timestamp comprises:

starting the second counter in response to the sensed voltage crossing a predetermined threshold voltage in the first direction; and stopping the second counter in response to the sensed voltage crossing the predetermined threshold voltage in a second direction, the second direction opposing the first direction; and wherein the timestamp is based on the second count value of the second counter after stopping the second counter.

15. The method as recited in claim 13 further comprising:

periodically updating the timestamp based on the second counter started in response to the sensed voltage crossing the threshold voltage in the first direction and stopped in response to the sensed voltage crossing the threshold voltage in a second direction, the second direction opposing the first direction.

16. The method as recited in claim 13 wherein the sensed voltage is on a drain node of a power switch driving a light emitting diode circuit coupled to a power supply node.

17. The method as recited in claim 13 further comprising:

enabling valley detection to generate the timestamp in response to a regulated input voltage exceeding a voltage across a load driven by an output node.

18. The method as recited in claim 13 wherein the timestamp is generated in a calibration mode of operation and the control signal is generated in a normal mode of operation.

19. The method as recited in claim 1 wherein the first switching cycle occurs in a calibration mode of operation and the subsequent switching cycle occurs in a normal mode of operation.

20. The integrated circuit product as recited in claim 10 wherein the first switching cycle occurs in a calibration mode of operation and the second counter is enabled in a normal mode of operation.

* * * * *